(12) United States Patent
Cormenier et al.

(10) Patent No.: US 10,879,679 B2
(45) Date of Patent: Dec. 29, 2020

(54) DEVICE FOR COOLING HOT GASES IN A HIGH-VOLTAGE EQUIPMENT

(71) Applicant: Schneider Electric Industries SAS, Rueil-Malmaison (FR)

(72) Inventors: Thierry Cormenier, Saint Jean de Vedas (FR); Jerome Douchin, Claix (FR)

(73) Assignee: Schneider Electric Industries SAS, Rueil-Malmaison (FR)

(*) Notice: Subject to any disclaimer, the term of this patent is extended or adjusted under 35 U.S.C. 154(b) by 0 days.

(21) Appl. No.: 15/377,199

(22) Filed: Dec. 13, 2016

(65) Prior Publication Data

US 2017/0170639 A1 Jun. 15, 2017

(30) Foreign Application Priority Data

Dec. 15, 2015 (FR) ...................................... 15 62418

(51) Int. Cl.
| | |
|---|---|
| H02B 1/56 | (2006.01) |
| H02B 13/025 | (2006.01) |
| F28F 7/02 | (2006.01) |
| F28F 13/00 | (2006.01) |
| H05K 7/20 | (2006.01) |
| F28D 17/02 | (2006.01) |

(52) U.S. Cl.
CPC ................. *H02B 1/56* (2013.01); *F28F 7/02* (2013.01); *F28F 13/003* (2013.01); *H02B 13/025* (2013.01); *H05K 7/20509* (2013.01); *F28D 17/02* (2013.01)

(58) Field of Classification Search
CPC ............ F28F 7/02; F28F 13/003; F28D 17/02
USPC ............. 165/133, 9.1, 9.2, 9.3, 9.4; 219/157
See application file for complete search history.

(56) References Cited

U.S. PATENT DOCUMENTS

| | | | | |
|---|---|---|---|---|
| 2,586,250 | A * | 2/1952 | Parker ..................... | F28D 17/02 165/10 |
| 2,706,109 | A * | 4/1955 | Tor ........................ | F28D 19/044 165/10 |
| 3,448,231 | A * | 6/1969 | Heft ....................... | H01H 9/342 218/89 |
| 3,555,224 | A * | 1/1971 | Frind ..................... | H01H 9/342 218/34 |
| 4,180,177 | A | 12/1979 | Gunderman et al. | |

(Continued)

FOREIGN PATENT DOCUMENTS

| | | | | |
|---|---|---|---|---|
| CA | 2659944 A1 * | 11/2009 | ........... | F28D 9/0062 |
| DE | 19528168 A1 * | 2/1997 | ............. | F28D 17/02 |

(Continued)

OTHER PUBLICATIONS

Thermal Conductivity of common Materials and Gases—EngineeringToolbox (Retrieved Dec. 2017).*

(Continued)

*Primary Examiner* — Len Tran
*Assistant Examiner* — Jenna M Hopkins
(74) *Attorney, Agent, or Firm* — Oblon, McClelland, Maier & Neustadt, L.L.P.

(57) ABSTRACT

The invention relates to a device for cooling hot gases generated by an internal arc in high voltage metal-enclosed switchgear and controlgear or prefabricated high voltage/ low voltage stations. This device comprises a metal foam cooling filter having a honeycomb structure.

7 Claims, 5 Drawing Sheets

(56) References Cited

U.S. PATENT DOCUMENTS

| | | | | |
|---|---|---|---|---|
| 4,218,596 A * | 8/1980 | Clausing | H01H 71/0214 | 200/304 |
| 5,004,874 A * | 4/1991 | Theisen | H01H 1/20 | 218/151 |
| 5,167,271 A * | 12/1992 | Lange | B22D 19/14 | 164/103 |
| 5,416,455 A * | 5/1995 | Moldovan | H01H 9/34 | 335/132 |
| 5,816,332 A * | 10/1998 | Alhamad | A62C 3/0257 | 169/45 |
| 5,889,249 A * | 3/1999 | Rival | H01H 9/342 | 218/149 |
| 6,699,563 B1 * | 3/2004 | Alhamad | A62C 3/06 | 169/45 |
| 6,762,389 B1 * | 7/2004 | Crooks | H01H 9/342 | 218/157 |
| 6,896,512 B2 * | 5/2005 | Rattner | F23D 14/16 | 126/91 R |
| 6,977,354 B1 * | 12/2005 | Shea | H01H 9/342 | 218/157 |
| 7,147,041 B2 * | 12/2006 | Mitchell | H01L 23/367 | 165/80.3 |
| 7,328,831 B1 * | 2/2008 | Topolski | B22F 3/1137 | 228/227 |
| 7,401,643 B2 * | 7/2008 | Queheillalt | C23C 14/046 | 165/104.21 |
| 7,584,613 B1 * | 9/2009 | Crow | F02G 1/043 | 60/519 |
| 8,413,419 B2 * | 4/2013 | Mungas | F02K 9/34 | 60/206 |
| 10,020,143 B2 * | 7/2018 | Rival | H01H 33/62 | |
| 10,134,537 B2 * | 11/2018 | Fonseca | H01H 9/342 | |
| 2004/0123980 A1 * | 7/2004 | Queheillalt | C23C 14/046 | 165/133 |
| 2005/0236142 A1 * | 10/2005 | Boudreaux | F28F 3/02 | 165/80.3 |
| 2006/0163319 A1 * | 7/2006 | Ervin | A47J 36/02 | 228/101 |
| 2006/0245987 A1 * | 11/2006 | Schmidt | B01J 19/0093 | 422/198 |
| 2007/0284095 A1 * | 12/2007 | Wang | F28D 7/10 | 165/166 |
| 2008/0149299 A1 * | 6/2008 | Slaughter | B22F 3/1055 | 165/10 |
| 2008/0226870 A1 * | 9/2008 | Sypeck | B32B 5/26 | 428/137 |
| 2009/0042071 A1 * | 2/2009 | Fischer | B01J 8/067 | 429/415 |
| 2009/0308571 A1 * | 12/2009 | Thompson | F28F 13/003 | 165/79 |
| 2009/0321045 A1 * | 12/2009 | Hernon | F28F 13/003 | 165/80.2 |
| 2010/0170876 A1 * | 7/2010 | Bach | H01H 9/342 | 218/157 |
| 2011/0123409 A1 * | 5/2011 | Phamhuu | B01J 19/0093 | 422/211 |
| 2012/0077992 A1 * | 3/2012 | Hutter | B01F 5/0451 | 549/315 |
| 2012/0247732 A1 * | 10/2012 | Suzuki | F28F 7/02 | 165/104.14 |
| 2013/0043071 A1 * | 2/2013 | Subramaniam | H02G 5/10 | 174/70 B |
| 2013/0065973 A1 * | 3/2013 | Hirschberg | B01F 5/0691 | 516/9 |
| 2013/0112657 A1 * | 5/2013 | Degda | H01H 9/342 | 218/157 |
| 2013/0116354 A1 * | 5/2013 | Rohatgi | B29C 44/3453 | 521/97 |
| 2013/0153435 A1 * | 6/2013 | Sandoval | C25C 7/02 | 205/560 |
| 2014/0020877 A1 * | 1/2014 | Suzuki | F01N 3/2828 | 165/181 |
| 2014/0093227 A1 * | 4/2014 | McGuffey | H05B 3/16 | 392/465 |
| 2014/0319100 A1 * | 10/2014 | Lammers | H01H 9/342 | 218/157 |
| 2015/0014277 A1 * | 1/2015 | Theisen | H01H 9/34 | 218/1 |
| 2015/0136740 A1 * | 5/2015 | Afshari | H01H 33/08 | 218/149 |
| 2015/0168087 A1 * | 6/2015 | Kim | F28F 21/08 | 361/720 |
| 2015/0246484 A1 * | 9/2015 | Hirschberg | B01F 5/0619 | 366/336 |
| 2015/0270075 A1 * | 9/2015 | Das | H01H 9/342 | 218/149 |
| 2015/0279579 A1 | 10/2015 | Pillet | | |
| 2016/0133413 A1 * | 5/2016 | Bock | H01H 50/026 | 361/142 |
| 2017/0104500 A1 * | 4/2017 | Bai | H04B 1/036 | |
| 2017/0145562 A1 * | 5/2017 | Farquhar | B01D 1/00 | |
| 2018/0320985 A1 * | 11/2018 | Salim Shirazy | F28D 15/046 | |
| 2018/0331016 A1 * | 11/2018 | Kang | H01L 23/427 | |

FOREIGN PATENT DOCUMENTS

| | | | | |
|---|---|---|---|---|
| EP | 2400252 A1 * | 12/2011 | | F28F 13/003 |
| FR | 588533 A * | 5/1925 | | F28D 17/02 |
| FR | 1441240 | 6/1966 | | |
| JP | 2004276113 A * | 10/2004 | | F28D 17/02 |
| WO | WO 0206747 A1 * | 1/2002 | | C23C 14/046 |
| WO | WO 2004085944 A2 * | 10/2004 | | F23L 15/02 |
| WO | WO 2007149535 A1 * | 12/2007 | | B22F 3/1112 |

OTHER PUBLICATIONS

Bioinspired engineering of honeycomb structure—using nature to inspire human innovation—Zhang (2015).*
Kinetic Theory of Gases—NASA (May 2015) (Year: 2015).*
"Honeycomb Panel"—Giordano Bui (Feb. 15, 2015) (Year: 2015).*
French Preliminary Search Report dated May 27, 2016 in French Application 15 62418 filed on Dec. 15, 2015 (with English Translation of Categories Cited Documents).

* cited by examiner

… (1)

DEVICE FOR COOLING HOT GASES IN A HIGH-VOLTAGE EQUIPMENT

TECHNICAL FIELD

The invention relates to the safety of persons operating high voltage metal-enclosed switchgear and controlgear or prefabricated high voltage/low voltage stations and more specifically relates to a device for cooling hot gases generated by an internal arc fault. These cooling devices may, among other things, be used to pass the tests of the IEC 62271-200 and IEC 62271-202 standards, in particular when the high voltage switchgear or controlgear is installed in a reduced space. They can also be used to minimise risks not covered by these standards, such as the rise in pressure in the electrical room, or the risk of a fire start.

In the remainder of the description, the term High Voltage corresponds to an alternating voltage greater than 1000 Volts. Nevertheless, such a device could also be used for low voltage switchgear and controlgear.

STATE OF THE PRIOR ART

One of the known failure modes in high voltage metal-enclosed switchgear and controlgear is the internal arc, which is a short-circuit circulating in air or in $SF_6$ (sulphur hexafluoride) between conductors, or between a conductor and earth. The arc is a plasma of ionised gas, the equilibrium temperature of which is very high. It is designated "internal" because it takes place inside a metal enclosure. In addition to the classical effects of a short-circuit (heating of conductors, electromagnetic effects), the internal arc is characterised by an enormous quantity of energy transmitted to the fluid (gas). The energy dissipated, going up to several tens of megajoules in one second, generates thermal effects and pressure effects which cause an abundant expulsion of hot gases. This creates a risk for the operator during expansion of these gases in insufficient finite volumes or when these gases pass through an operating area. Finite volumes should be understood as opposed to infinite volumes, when the expansion and the evacuation of the gases takes place directly to the outside or to a highly ventilated compartment of a transformation station such as a local transformer, without going through the operating area of the switchgear or controlgear.

It should be noted that in certain cases, the gases are evacuated from the electrical room to the open air, outside of the building, via a conduit which is similar to a chimney. In other cases, the gases are discharged directly inside the electrical room, via an orifice situated on the faces of the metal enclosure not accessible to the operators, usually the roof or the rear face of the enclosure. When the internal arc occurs in the metal enclosure, the pressure increases suddenly in the faulty compartment. The speed of the gases evacuated from the enclosure is very high, such that the flow of hot gas can rebound against the ceiling and the side walls of the electrical room thereby constituting a danger for any operators finding themselves therein. To limit the speed of flow of these hot gases and to control the direction thereof, solutions of the prior art use a buffer cooler, installed above the compartment, and constituted of metal filters of the type: vertical or horizontal fins, superimposed grills or cooling filters constituted of an assembly of pozzolan type volcanic rock.

A drawback of these coolers stems from the fact that, on the one hand, pozzolan based coolers have few reproducibility criteria, and are generators of dust which can have an impact on dielectric ageing and, on the other hand, the metal filters have a limited cooling capacity when they are simply produced from perforated sheeting, or stacked metal grills.

An aim of the invention is to overcome the drawbacks of the prior art, described above.

DESCRIPTION OF THE INVENTION

This aim is attained by means of a device for cooling hot gases generated by an internal arc in high voltage metal-enclosed switchgear and controlgear.

The device according to the invention comprises a metal foam cooling filter having an alveolar structure of variable dimensions with superimposed and reproducible layers, commonly called honeycomb structure.

In a first embodiment, said metal foam filter comprises spherical cells connected together so as to have openings in all directions.

In a second embodiment, the metal foam filter comprises cells forming hexahedral meshes.

Preferentially, the diameter of said hexahedral cells lies between 1 and 4 cm.

In a third embodiment, the metal foam filter comprises cells forming square meshes.

In the different embodiments, the cooling filter is made of aluminium or cast iron.

Aluminium has in fact good corrosion resistance and cast iron represents an inexpensive solution. Other metals could also be used.

BRIEF DESCRIPTION OF THE DRAWINGS

Other characteristics and advantages of the invention will become clear from the description that follows, taken as a non-limiting example, while referring to the appended figures in which.

DETAILED DESCRIPTION OF PARTICULAR EMBODIMENTS

Figure 1:
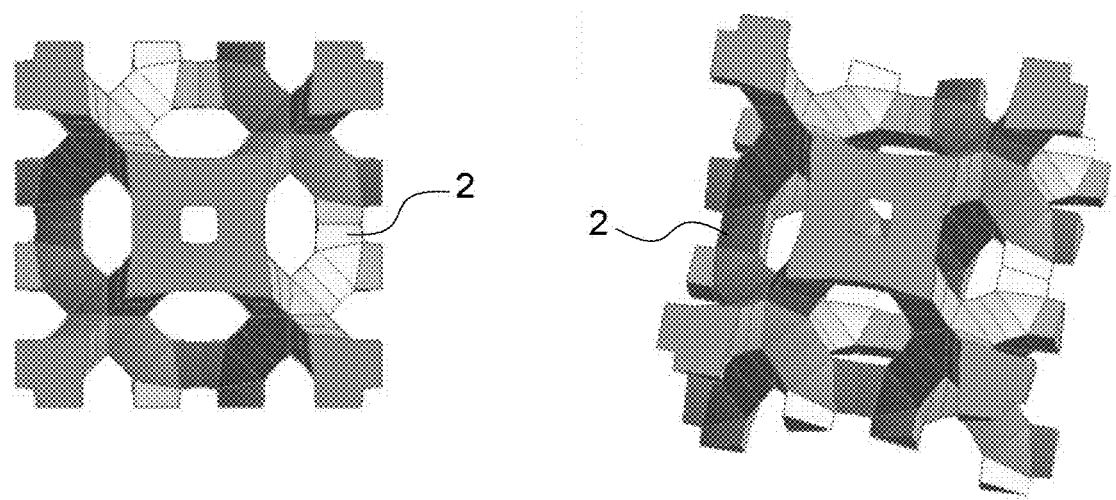
FIG. 1 schematically illustrates a top view of a cell of a cooling filter in a preferred embodiment according to the invention.
Figure 2:
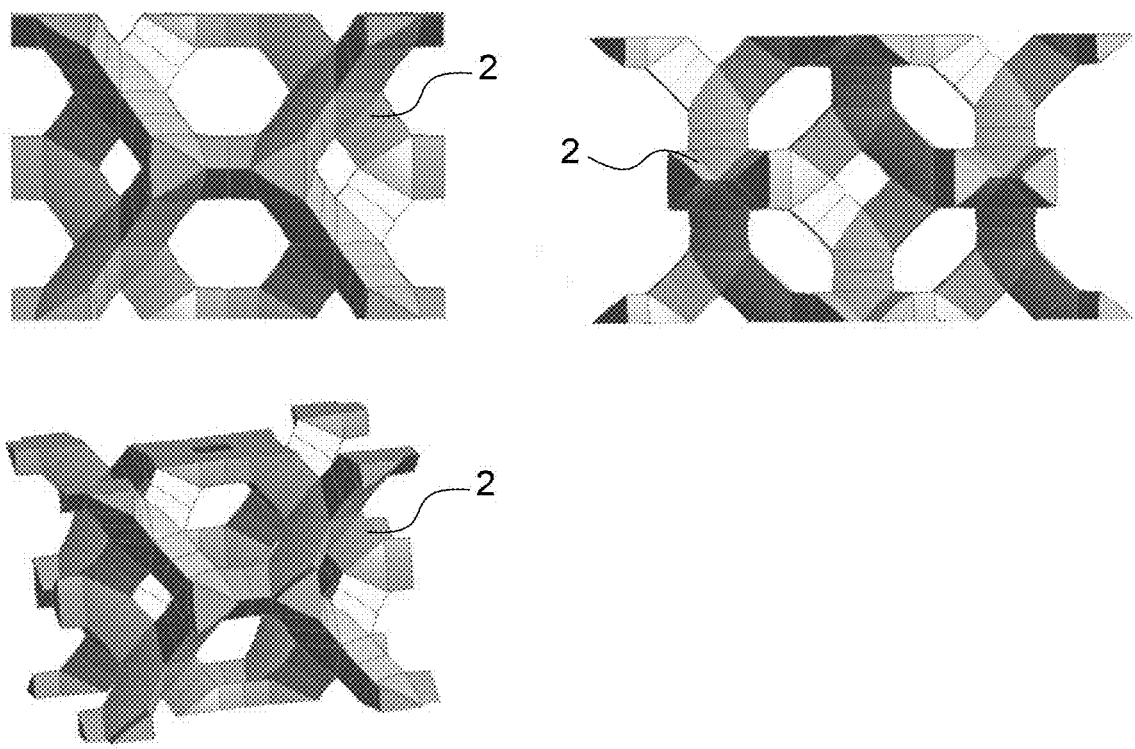
FIG. 2 schematically illustrates several side views of the cell of FIG. 1.

FIGS. 1 and 2 schematically represent, respectively, a top view and a side view of a hexahedral cell 2 for manufacturing a metal foam cooling filter, made of aluminium or cast iron for example, intended to equip a metal enclosure containing HV switchgear or controlgear. The metal foam cooling filter may also be installed between two expansion volumes in a prefabricated high voltage/low voltage station or a prefabricated electrical room.

Figure 3:
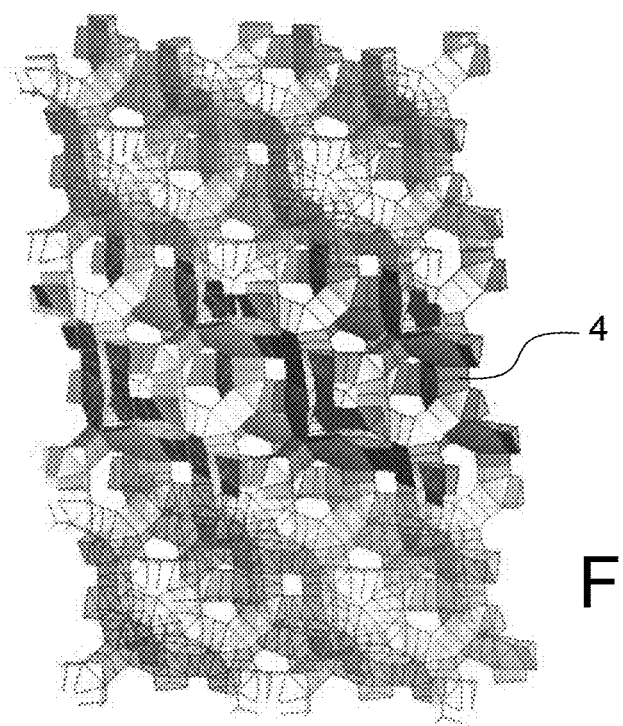
FIG. 3 schematically illustrates a three-dimensional view of an assembly of several cells of FIG. 1.

FIG. 3 represents a 3D meshed honeycomb structure obtained by assembly of six cells 2. As may be seen in this FIG. 3, the cells 2 are assembled such that each of them has openings in all spatial directions. This structure favours an increase in turbulence within the cells, increasing the transfer of heat in internal arc conditions. It ensures at the same time a high overall porosity, substantially limiting the increase in internal pressure upstream of the filter. The gain in flow (speed, temperature, etc.) is thus obtained without notable impact on the switchgear or controlgear.

Figure 4:
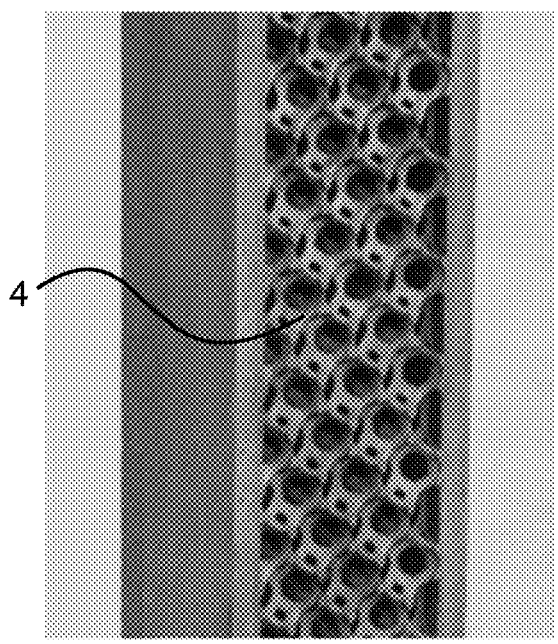
FIG. 4 shows a partial view of an example of embodiment of a cooling filter equipping a cooling device constituted by the assembly of FIG. 3.

FIG. 4 represents an example of cooling filter 4 equipping a device obtained by the assembly mode illustrated by FIG. 3 intended to be installed in a metal-enclosed module containing high voltage switchgear or controlgear. This cooling filter has a high porosity which favours an increase in turbulence in the cells and an increase in heat transfers in internal arc conditions.

Preferentially, the diameter of the cells 2 lies between 1 and 4 cm and the thickness of the cooling filter 4 is from 4 to 20 cm, for example 10 cm.

In another embodiment, not represented, the metal foam cooling filter comprises cells forming square meshes.

The structure of the cooling filter 4 is closely linked to the dimensions of the high voltage metal enclosure in which it will be installed. In fact, the cooling filter 4 creates an obstacle to the flow of hot gases resulting from the appearance of an internal arc in the module containing the high voltage switchgear or controlgear. The result is a pressure jump through this cooling filter which induces an increase in pressure in the high voltage enclosure upstream of the filter. Yet, the resulting pressure must remain within the structural limit of the metal enclosure. If the resistance to flow is too low, the thermal effect will not be significant. Also, the dimensions of the cooling filter according to the invention are defined while take into account the following two situations:

In the case where the internal arc occurs far from the cooling filter 4 and near the bottom of the metal enclosure, the first pressure peak in the arc compartment is not influenced by the cooling filter 4. In fact, more than 10 ms are required for the pressure wave to reach the cooling filter 4 and return to the arc area. The power of the arc drops after having reached a peak at the end of 10 ms. The dimensions of the cooling filter 4 are thus calculated so as to limit the increase in pressure due to the cooling filter 4, to the same level as the first pressure peak that would have been observed within the metal enclosure, in the absence of the cooling filter 4.

In the case where the internal arc occurs near to the cooling filter 4, the impact of the latter on the increase in pressure is negligible. In fact, although the passage of gases through the cooling filter 4 accelerates the rise in pressure in the metal enclosure, this pressure drops considerably in several milliseconds when the hot gases reach the cooling filter 4 due to the fact that it is directly proportional to the density of the gas. This phenomenon makes the increase in pressure due to the cooling filter 4 almost negligible at the end of several milliseconds.

The device according to the invention makes it possible to:

slow down the gas speed in a metal enclosure containing HV switchgear or controlgear or in an insufficient expansion volume situated downstream of the metal enclosure;

cool the temperature of these gases and create turbulences inside the metal enclosure, or the downstream volume;

contain the combustion of flammable gases inside the metal enclosure, or the downstream volume;

attain these objectives without increasing the pressure peaks in the metal enclosure, or the downstream volume.

Figure 5:
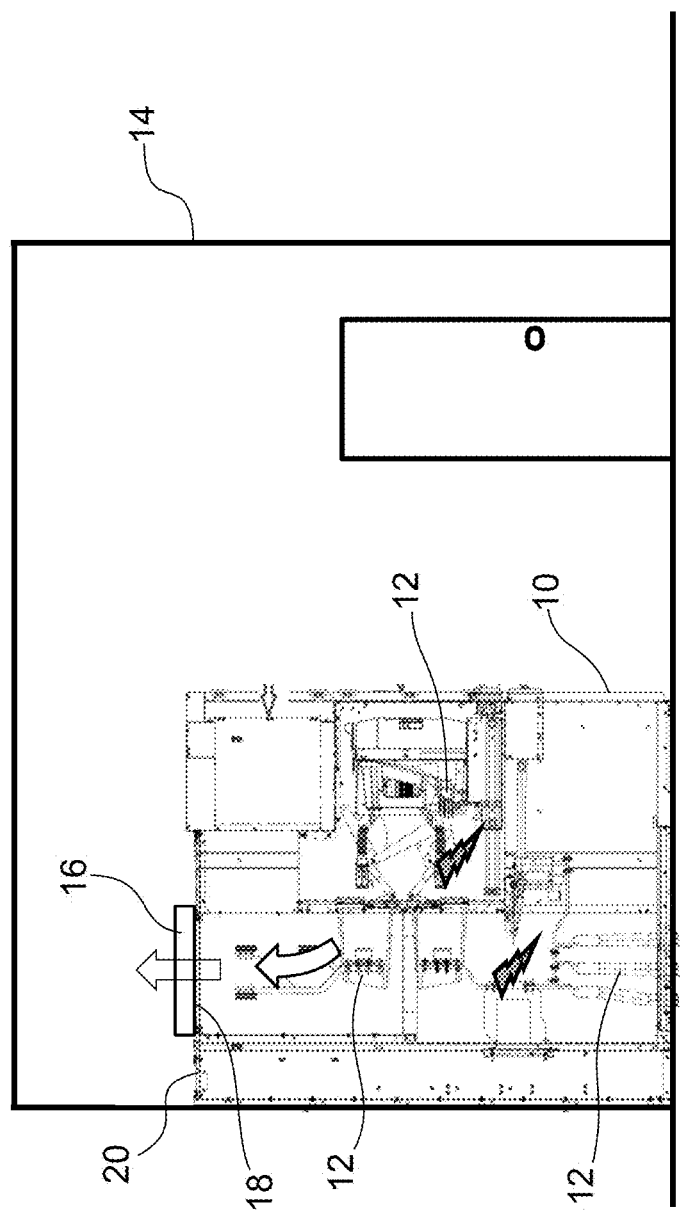
FIGS. 5 to 7 represent three possibilities of installation of a cooling filter in high voltage metal-enclosed switchgear and controlgear or a prefabricated high voltage/low voltage station.
Figure 6:
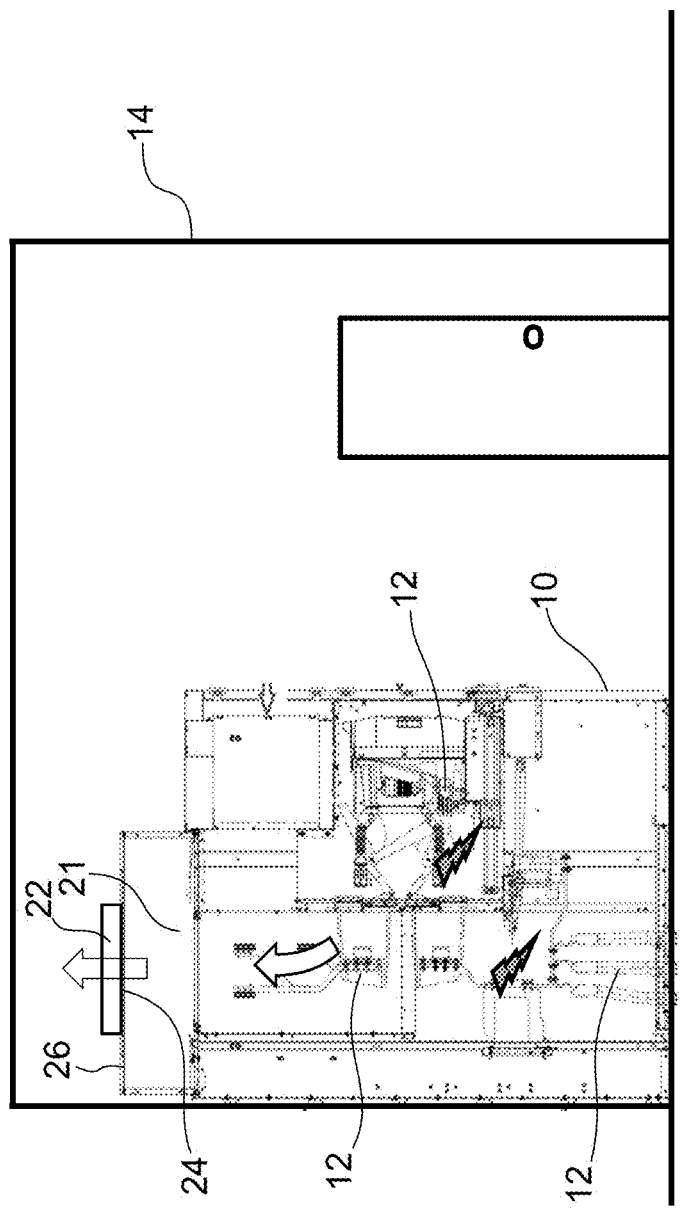
Figure 7:
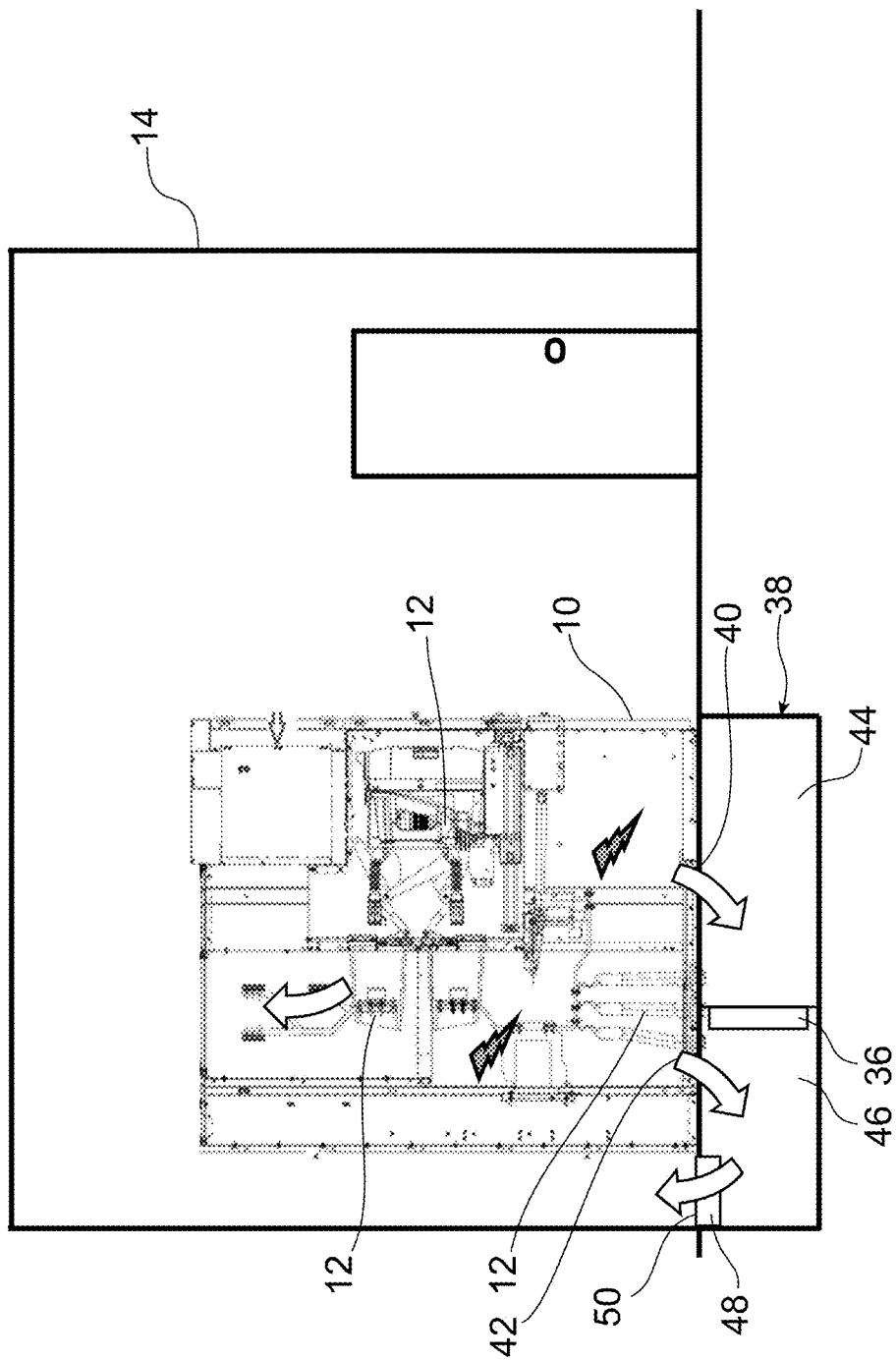

FIGS. 5 to 7 schematically represent a metal enclosure 10 containing high voltage switchgear or controlgear 12 arranged in an electrical room 14.

In FIG. 5, a cooling filter 16 is arranged on an orifice 18 pierced on the upper face 20 of the enclosure 10 so as to cool and to reduce the speed of evacuation of the hot gases in the room 14.

FIG. 6 represents another embodiment of a cooling filter which differs from the filter of FIG. 5 in that an additional buffer volume 21 is arranged above the module containing the high voltage switchgear or controlgear, in particular to limit the pressure, notably, in high performance modules (40-50 kA). A cooling filter 22 is arranged on an orifice 24 pierced on the upper face 26 of the enclosure 10.

In FIG. 7, a cooling filter 36 is arranged in an expansion cavity 38 below the electrical room 14. The hot gases generated in the metal enclosure 10 are evacuated to the expansion cavity 38 via a first orifice 40 and a second orifice 42. The cooling filter 36 divides the expansion cavity 38 into two areas 44 and 46. A second cooling filter 48 is arranged on a third orifice 50 linking the second area 46 and the inside of the electrical room 14.

The cooling filter 36 slows down the flow of hot air which is evacuated via the orifice 40 to the first area 44 whereas the second cooling filter 48 slows down the flow of hot air which is evacuated via the third orifice 50 from the second area 46 to the inside of the electrical room 14.

The invention claimed is:

1. An enclosure, comprising:
a high voltage switchgear; and a device configured to cool hot gases generated by an internal arc in the high voltage switchgear, the device including a metal foam cooling filter disposed on an opening of the enclosure and having an alveolar structure of variable dimensions obtained by assembling at least six cells to form a honeycomb structure of hexahedral cells, the metal foam cooling filter being configured to slow a speed of expansion of the hot gases within the enclosure, openings of each hexahedral cell being obstructed by structural members of adjacent hexahedral cells in contact therewith.

2. The enclosure according to claim 1 wherein the hexahedral cells are connected together so as to have openings in all directions.

3. The enclosure according to claim 1 wherein the hexahedral cells form meshes.

4. The enclosure according to claim 3 wherein the hexahedral cells have a diameter lying between 1 and 4 cm.

5. The enclosure according to claim 1 wherein the cooling filter is made of aluminium.

6. The enclosure according to claim 1 wherein the cooling filter is made of cast iron.

7. The enclosure according to claim 1, wherein the enclosure is a metal enclosure.

* * * * *